US008345892B2

(12) United States Patent
Jung et al.

(10) Patent No.: US 8,345,892 B2
(45) Date of Patent: Jan. 1, 2013

(54) FRONT SURROUND SOUND REPRODUCTION SYSTEM USING BEAM FORMING SPEAKER ARRAY AND SURROUND SOUND REPRODUCTION METHOD THEREOF

(75) Inventors: Chi-ho Jung, Seoul (KR); Seong-cheol Jang, Yongin-si (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 1239 days.

(21) Appl. No.: 11/693,124

(22) Filed: Mar. 29, 2007

(65) Prior Publication Data

US 2008/0101631 A1 May 1, 2008

(30) Foreign Application Priority Data

Nov. 1, 2006 (KR) ........................ 10-2006-0107471

(51) Int. Cl.
*H03G 5/00* (2006.01)

(52) U.S. Cl. ................. 381/98; 381/17; 381/97; 381/99

(58) Field of Classification Search .................. 381/300, 381/303, 307, 27, 1, 17–18, 97–99, 26
See application file for complete search history.

(56) References Cited

U.S. PATENT DOCUMENTS 5,870,484 A * 2/1999 Greenberger ................. 381/300
7,319,641 B2 1/2008 Goudie et al.
7,664,276 B2 * 2/2010 McKee Cooper ............. 381/103
7,720,237 B2 * 5/2010 Bharitkar et al. ............... 381/98
7,822,496 B2 10/2010 Asada et al.
2003/0210794 A1 * 11/2003 Sato et al. ........................ 381/22
2006/0067548 A1 * 3/2006 Slaney et al. .................. 381/303
2006/0204022 A1 * 9/2006 Hooley et al. ................. 381/117
2009/0296964 A1 * 12/2009 Bienek et al. ................. 381/303

FOREIGN PATENT DOCUMENTS

JP 2002-500844 1/2002
JP 2004-172661 A 6/2004
JP 2006-121125 A 5/2006
KR 1997-58323 7/1997
KR 10-2004-0050904 A 6/2004
KR 2004-81794 9/2004
KR 10-2005-0101571 A 10/2005
WO 2004/075601 9/2004

OTHER PUBLICATIONS

Korean Notice of Allowance issued on Nov. 30, 2007 of the application No. KR 10-2006-0107471 (4 pages).

* cited by examiner

*Primary Examiner* — Disler Paul
(74) *Attorney, Agent, or Firm* — Stanzione & Kim, LLP

(57) ABSTRACT

A front surround sound reproduction system using a speaker array, a front surround sound reproduction system to perform stereo localization using a beam forming speaker array, and a surround sound reproduction method thereof. A front surround sound reproduction apparatus using a plurality of speakers includes a first signal processing unit to adjust a frequency characteristic of each first and second channel signal and to output the adjusted signals to left and right speakers assigned according to a frequency band, a second signal processing unit to generate a plurality of channel signals by copying the first and second channel signals, to adjust a signal characteristic of each of the plurality of channel signals, and to output the adjusted signals to a speaker array in the center, and a speaker unit having a plurality of speakers to reproduce the signals output from the first signal processing unit and the second signal processing unit.

17 Claims, 7 Drawing Sheets

FRONT SURROUND SOUND REPRODUCTION SYSTEM USING BEAM FORMING SPEAKER ARRAY AND SURROUND SOUND REPRODUCTION METHOD THEREOF

CROSS-REFERENCE TO RELATED APPLICATIONS

This application claims priority under 35 U.S.C. §119(a) from Korean Patent Application No. 10-2006-0107471, filed on Nov. 1, 2006, in the Korean Intellectual Property Office, the disclosure of which is incorporated herein in its entirety by reference.

BACKGROUND OF THE INVENTION

1. Field of the Invention

The present general inventive concept relates to a front surround sound reproduction system using a speaker array, and more particularly, to a front surround sound reproduction system to perform stereo localization using a beam forming speaker array, and a surround sound reproduction method thereof.

2. Description of the Related Art

A conventional front surround sound reproduction system produces a stereoscopic effect from a front speaker array without side or rear speakers using a sound projector technique.

That is, a front surround sound reproduction system forms sound beams from a surround channel signal using a speaker array and emits the sound beams to walls so that reflection sounds reflected from the walls reaches a listener. Thus, the listener can enjoy a stereophonic sound as if the sound were coming from side and rear speakers due to the reflected sounds.

A technique related to such a front surround sound reproduction system is disclosed in WO 04/075601 (filed 2 Sep. 2004 entitled SOUND BEAM LOUDSPEAKER SYSTEM).

FIG. 1 is a diagram of a front speaker part 100 of a front surround sound reproduction system.

Referring to FIG. 1, the front speaker part 100 includes a front panel 110 which includes a beam forming speaker array 111 for reproducing a high frequency signal, and woofers 112 for reproducing a middle-low frequency signal.

Thus, the front surround sound reproduction system divides an input surround channel signal into a high frequency signal and a middle-low frequency signal, provides the high frequency signal to the beam forming speaker array 111, and provides the middle-low frequency signal to the woofers 112 for reproducing a bass sound.

However, since a conventional front surround sound reproduction system is for reproducing a multi-channel stereophonic sound signal, the conventional front surround sound reproduction system is weak at reproducing a stereo signal. Thus, since the conventional front surround sound reproduction system uses a speaker array including a plurality of low-power, treble speakers as illustrated in FIG. 1 when reproducing a stereo signal, a sound image is scattered and a left-right phase difference is small. That is, the conventional front surround sound reproduction system has a problem in that stereo left-right separation and sound image localization decrease during a stereo reproduction mode.

SUMMARY OF THE INVENTION

The present general inventive concept provides a front surround sound reproduction system to efficiently perform stereo separation and localization using a beam forming speaker array.

The present general inventive concept also provides a front surround sound reproduction method of efficiently performing stereo separation and localization using a beam forming speaker array.

The present general inventive concept also provides a front surround sound reproduction system to efficiently perform stereo separation and localization using a beam forming speaker array and a surround sound reproduction method thereof.

Additional aspects and utilities of the present general inventive concept will be set forth in part in the description which follows and, in part, will be obvious from the description, or may be learned by practice of the general inventive concept.

The foregoing and/or other aspects and utilities of the present general inventive concept are achieved by providing a front surround sound reproduction apparatus using a plurality of speakers, the apparatus including a first signal processing unit to adjust a frequency characteristic of each first and second channel signal and to output the adjusted signals to left and right speakers assigned according to a frequency band, a second signal processing unit to generate a plurality of channel signals by copying the first and second channel signals, to adjust a signal characteristic of each of the plurality of channel signals, and to output the adjusted signals to a speaker array in a center of the front surround sound reproduction apparatus, and a speaker unit having a plurality of speakers to reproduce the signals output from the first signal processing unit and the second signal processing unit.

The foregoing and/or other aspects and utilities of the present general inventive concept may also be achieved by providing a front surround sound reproduction apparatus using a plurality of speakers, the apparatus including a down mixer to down mix a multi-channel signal to first and second channel signals, a first signal processing unit to adjust a frequency characteristic of each of the first and second channel signals down-mixed by the down mixer and to output the adjusted signals to left and right speakers assigned according to a frequency band, a second signal processing unit to generate a plurality of channel signals by copying the first and second channel signals, to adjust a signal characteristic of each of the plurality of channel signals, and to output the adjusted signals to a speaker array in a center of the front surround sound reproduction apparatus, and a speaker unit having a plurality of speakers to reproduce the signals output from the first signal processing unit and the second signal processing unit.

The foregoing and/or other aspects and utilities of the present general inventive concept may also be achieved by providing a front surround sound reproduction method using a plurality of speakers, the method including determining whether an input signal is a stereo sound for first and second channel or a multi-channel signal, if it is determined that the input signal is a multi-channel signal, converting the multi-channel signal to first and second channel signals by down mixing the multi-channel signal, adjusting a frequency characteristic of each of the first and second channel signals down-mixed and outputting the adjusted signals to left and right speakers assigned according to a frequency band, and generating a plurality of channel signals by copying the first and second channel signals, adjusting a signal characteristic of each of the plurality of channel signals, and outputting the adjusted signals to a speaker array in a center of the front surround sound reproduction apparatus.

The foregoing and/or other aspects and utilities of the present general inventive concept may also be achieved by providing a front surround sound reproduction apparatus using a left speaker, a right speaker, and a speaker array, the apparatus including a first signal processing unit to adjust frequency characteristics of a left channel signal and a right channel signal and to output the adjusted left channel signal and the adjusted right channel signal to the left speaker and the right speaker respectively, and a second signal processing unit to generate copies of the left channel signal and the right channel signal to correspond to each of a plurality of speakers in the speaker array and to sequentially amplify and delay the generated copies based on positions of each of the plurality of speakers in the speaker array.

The second signal processing unit may sequentially amplify and delay the generated copies by applying geometrical weights to the generated copies based on the positions of each of the plurality of speakers in the speaker array.

The frequency characteristics may include a magnitude and a phase of the left channel signal and the right channel signal.

The foregoing and/or other aspects and utilities of the present general inventive concept may also be achieved by providing a front surround sound reproduction method using a left speaker, a right speaker, and a speaker array, the method including adjusting frequency characteristics of a left channel signal and a right channel signal, outputting the adjusted left channel signal and the adjusted right channel signal to the left speaker and the right speaker respectively, generating copies of the left channel signal and the right channel signal to correspond to each of a plurality of speakers in the speaker array, and sequentially amplifying and delaying the generated copies based on positions of each of the plurality of speakers in the speaker array.

The sequential amplification and delay of the generated copies may occur by applying geometrical weights to the generated copies based on the positions of each of the plurality of speakers in the speaker array.

The frequency characteristics may include a magnitude and a phase of the left channel signal and the right channel signal.

BRIEF DESCRIPTION OF THE DRAWINGS

These and/or other aspects and utilities of the present general inventive concept will become apparent and more readily appreciated from the following description of the embodiments, taken in conjunction with the accompanying drawings of which.

DETAILED DESCRIPTION OF THE PREFERRED EMBODIMENTS

Figure 1:
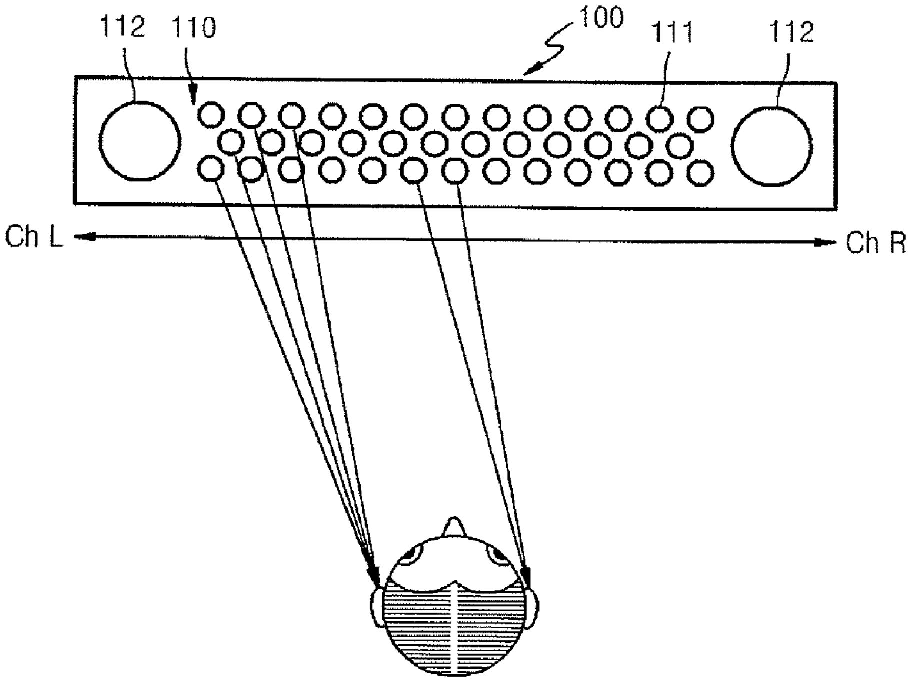
FIG. 1 (PRIOR ART)
FIG. 1 is a diagram of a front speaker part of a conventional front surround sound reproduction system.

Reference will now be made in detail to the embodiments of the present general inventive concept, examples of which are illustrated in the accompanying drawings, wherein like reference numerals refer to the like elements throughout. The embodiments are described below in order to explain the present general inventive concept by referring to the figures.

Figure 2:
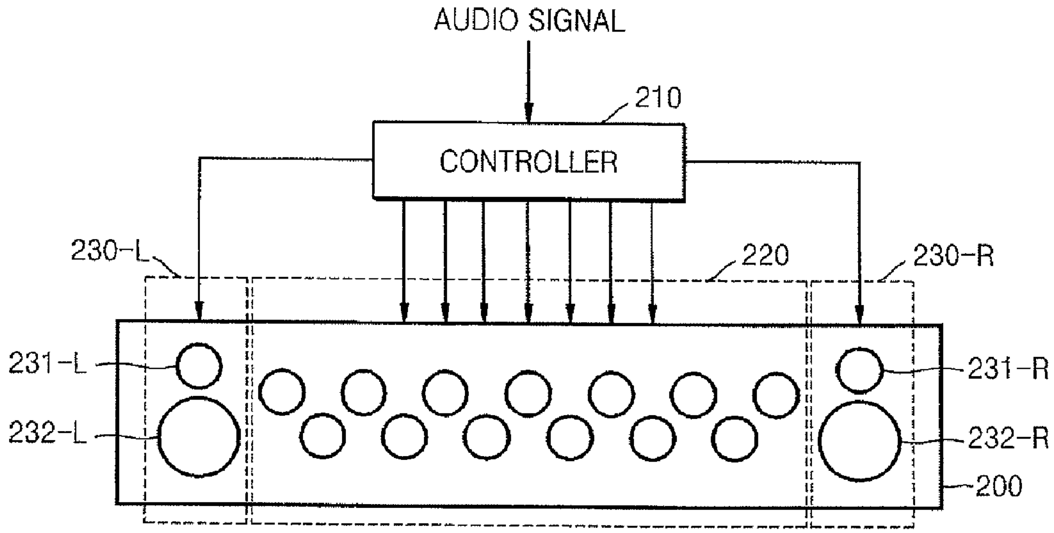
FIG. 2 is a block diagram of a front surround sound reproduction system according to an embodiment of the present general inventive concept.

FIG. 2 is a block diagram of a front surround sound reproduction system according to an embodiment of the present general inventive concept.

Referring to FIG. 2, the front surround sound reproduction system includes a controller 210 and a speaker unit 200.

The controller 210 determines whether an input digital audio signal is a multi-channel signal or a stereo signal, by referring to audio-related information contained in the input digital audio signal, and performs separate signal processing on the input digital audio signal depending on the determination result. That is, if it is determined that the input digital audio signal is a stereo signal, the controller 210 adjusts a frequency characteristic of each left and right channel signal and outputs the adjusted left and right channel signals to left and right speakers 230-L and 230-R assigned according to their frequency band, and generates a plurality of channel signals by copying the left and right channel signals, adjusts a signal characteristic of each of the plurality of channel signals, and outputs the adjusted channel signals to a center speaker array 220.

If it is determined that the input digital audio signal is a multi-channel signal, the controller 210 down-mixes the multi-channel signal to left and right channel signals, adjusts a frequency characteristic of each left and right channel signal and outputs the adjusted signals to the left and right speakers 230-L and 230-R, and generates sound beams by performing beam-forming processing on the multi-channel signal and outputs the generated sound beams to the center speaker array 220. In this case, the beam forming processing technology provides distorted directivity by respectively outputting signals, each having a sequentially constant delay, to speakers in the center speaker array 220.

The speaker unit 200 includes the left speaker 230-L including a left treble speaker 231-L and a left woofer 232-L, the right speaker 230-R including a right treble speaker 231-R and a right woofer 232-R, and the center speaker array 220 including a plurality of treble speakers. The left treble speaker 231-L or the right treble speaker 231-R may have higher power than ⅓ of the total combined power of the plurality of treble speakers of the center speaker array 220.

Figure 3:
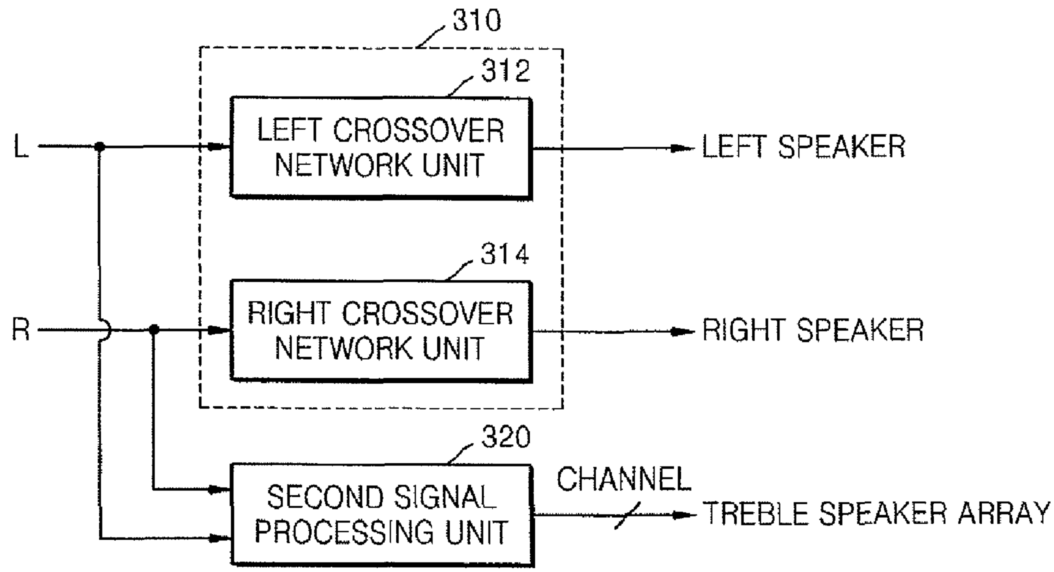
FIG. 3 is a block diagram of a controller illustrated in FIG. 2 when an input signal is a stereo signal, according to an embodiment of the present general inventive concept.

FIG. 3 is a block diagram of the controller 210 illustrated in FIG. 2 when an input signal is a stereo signal, according to an embodiment of the present general inventive concept.

Referring to FIG. 3, the controller 210 includes a first signal processing unit 310 and a second signal processing unit 320. The first signal processing unit 310 includes a left crossover network unit 312 and a right crossover network unit 314.

The left crossover network unit 312 adjusts a magnitude and a phase of a left channel signal L according to a frequency band to provide the adjusted left channel signal L to the left speaker 230-L. That is, the left crossover network unit 312 adjusts the level of the left channel signal L, converts a frequency component of the left channel signal L to a bass signal and a treble signal to fit characteristics of speakers through which the left channel signal L is output, and outputs the bass signal to the left woofer 232-L and the treble signal to the left treble speaker 231-L.

The right crossover network unit 314 adjusts a magnitude and a phase of a right channel signal R according to a frequency band to provide the adjusted right channel signal R to the right speaker 230-R. That is, the right crossover network unit 314 adjusts a level of the right channel signal R, converts a frequency component of the right channel signal R to a bass signal and a treble signal to fit characteristics of speakers through which the right channel signal R is output, and outputs the bass signal to the right woofer 232-R and the treble signal to the right treble speaker 231-R.

The second signal processing unit 320 generates a plurality of signals by copying the left and right channel signals L and R, applies the beam-forming processing technology to the plurality of generated signals, and outputs the plurality of beam forming processed signals to the center speaker array 220.

Figure 4:
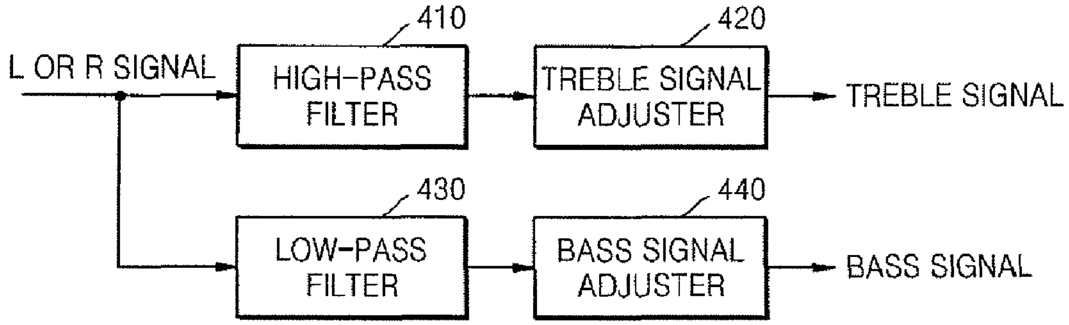
FIG. 4 is a block diagram of a left or right crossover network unit illustrated in FIG. 3, according to an embodiment of the present general inventive concept.

FIG. 4 is a block diagram of the left or right crossover network unit 312 or 314, respectively, as illustrated in FIG. 3, according to an embodiment of the present general inventive concept.

Referring to FIG. 4, a high-pass filter 410 performs high-pass filtering of the left or right channel signal L or R.

A treble signal adjuster 420 adjusts a magnitude and a phase of the treble signal filtered by the high-pass filter 410 and outputs the adjusted treble signal to the left or right treble speaker 231-L or 231-R.

A low-pass filter 430 performs low-pass filtering on the left or right channel signal L or R.

A bass signal adjuster 440 adjusts a magnitude and a phase of the bass signal filtered by the low-pass filter 430 and outputs the bass signal to the left or right woofer 232-L or 232-R.

Figure 5:
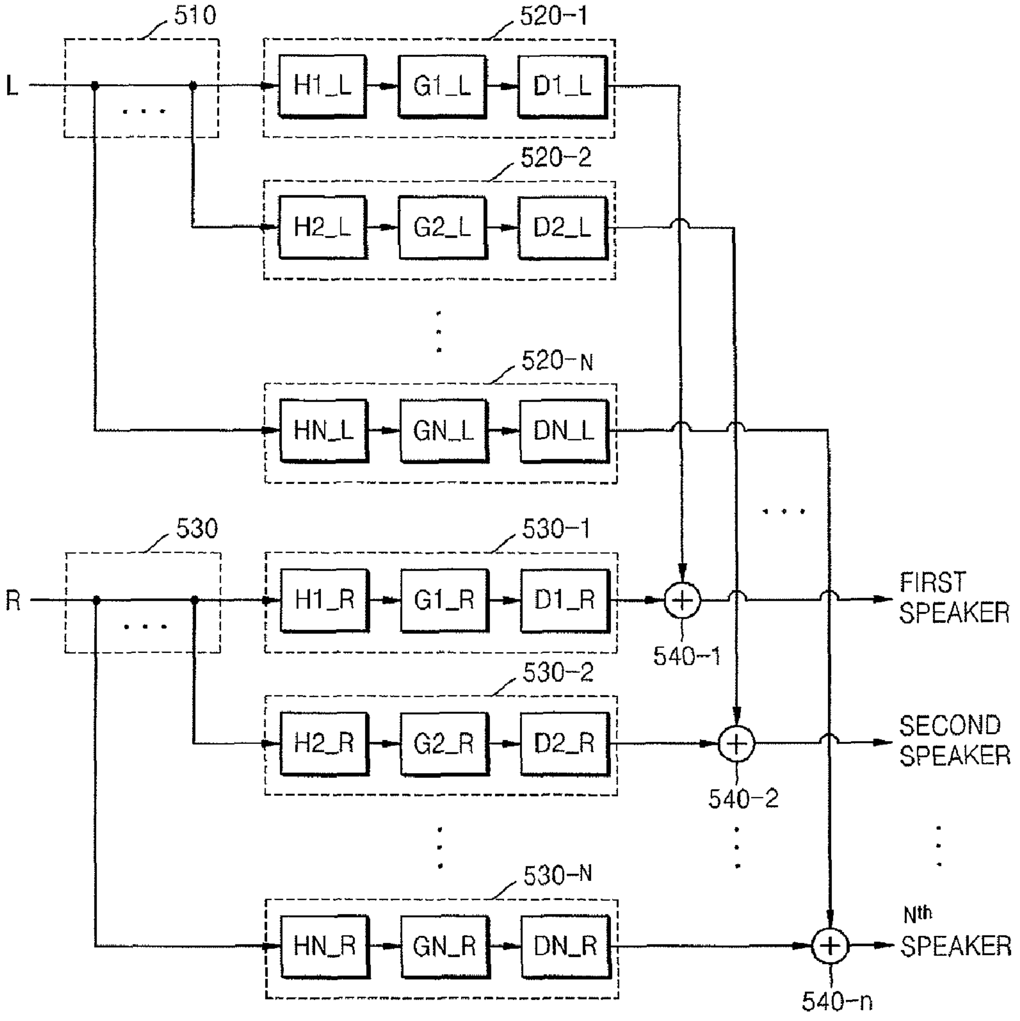
FIG. 5 is a block diagram of a second signal processing unit illustrated in FIG. 3, according to an embodiment of the present general inventive concept.

FIG. 5 is a block diagram of the second signal processing unit 320 illustrated in FIG. 3, according to an embodiment of the present general inventive concept.

Referring to FIG. 5, a left signal copying unit 510 generates N channel signals corresponding to a number of speakers in the center speaker array 220 of FIG. 2 by copying the left channel signal L using a predetermined copying circuit. The predetermined copying circuit may use a resistor array or a buffer technology.

Left signal adjusters 520-1, 520-2, . . . 520-*n* sequentially amplify and delay the N channel signals generated by the left signal copying unit 510. That is, high-pass filters H1_L, H2_L, . . . HN_L respectively perform high-pass filtering on the N channel signals. Gain adjusters G1_L, G2_L, . . . GN_L respectively and sequentially amplify the N channel signals filtered by the high-pass filters H1_L, H2_L, . . . HN_L by a different gain. Delay units D1_L, D2_L, . . . DN_L respectively and sequentially delay the N channel signals amplified by the gain adjusters G1_L, G2_L, . . . GN_L by a different delay. Thus, the gain adjusters G1_L, G2_L, . . . GN_L and the delay units D1_L, D2_L, . . . DN_L provide distorted directivity by generating signals that have a sequentially constant delay and gain. A distorted angle may be adjusted according to an amount of delay.

A right signal copying unit 530 generates N channel signals corresponding to the number of speakers in the center speaker array 220 of FIG. 2 by copying the right channel signal R using the predetermined copying circuit.

Right signal adjusters 530-1, 530-2, . . . 530-*n* sequentially amplifies and delays the N channel signals generated by the right signal copying unit 530. That is, high-pass filters H1_R, H2_R, . . . HN_R respectively perform high-pass filtering on the N channel signals. Gain adjusters G1_R, G2_R, . . . GN_R respectively and sequentially amplify the N channel signals filtered by the high-pass filters H1_R, H2_R, . . . HN_R by a different gain. Delay units D1_R, D2_R, . . . DN_R respectively and sequentially delay the N channel signals amplified by the gain adjusters G1_R, G2_R, . . . GN_R by a different delay. Thus, the gain adjusters G1_R, G2_R, . . . GN_R and the delay units D1_R, D2_R, . . . DN_R provide distorted directivity by generating signals that have a sequentially constant delay and gain. A distorted angle may be adjusted according to an amount of delay.

Adders 540-1, 540-2, . . . 540-*n* respectively add the left channel signals output from the left signal adjusters 520-1, 520-2, . . . 520-*n* to the right channel signals output from the right signal adjusters 530-1, 530-2, . . . 530-*n* and respectively output the results of the addition to the first, second, . . . nth speakers of the center speaker array 220.

Figure 6A:
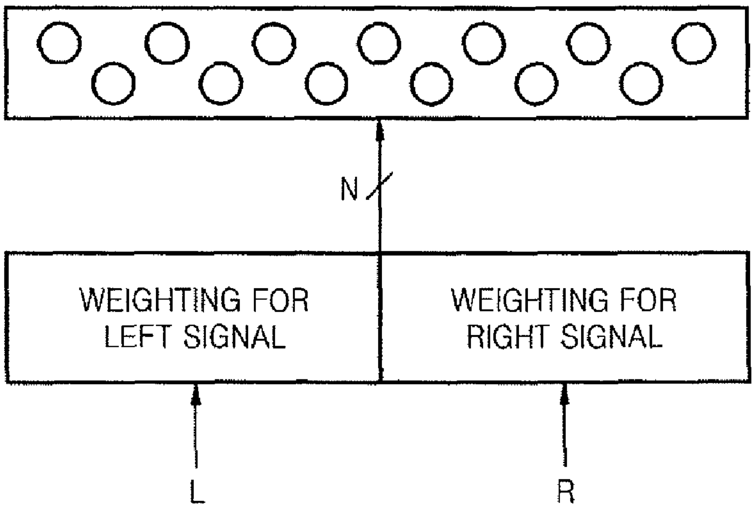
FIG. 6A is a conceptual diagram illustrating how to apply a gain to each channel signal in the second signal processing unit according to an embodiment of the present general inventive concept.

FIG. 6A is a conceptual diagram illustrating how to apply a gain to each channel signal in the second signal processing unit 320 of FIG. 5 according to an embodiment of the present general inventive concept.

Referring to FIG. 6A, predetermined weights are respectively added to the left and right channel signals of the second signal processing unit 320 of FIG. 5 to allow a listener to experience localization through the center speaker array 220 of FIG. 2.

Figure 6B:
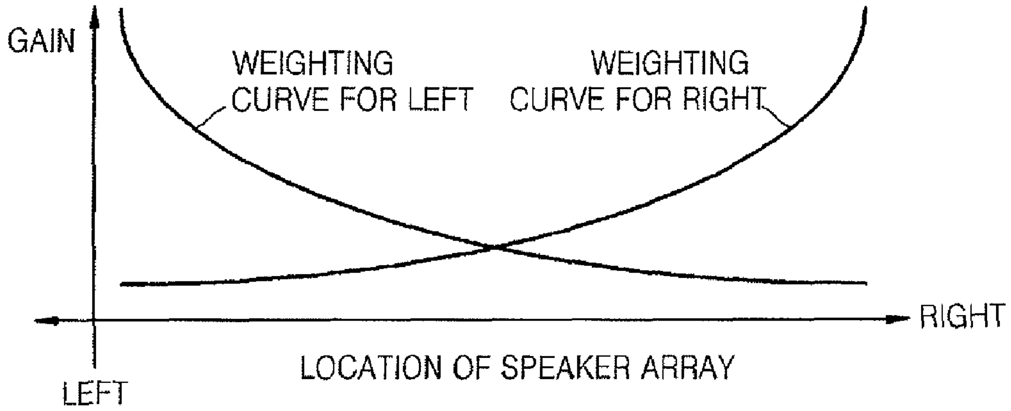
FIG. 6B is a weighting curve diagram illustrating the second signal processing unit of FIG. 3 applying a different weight to each channel signal according to an embodiment of the present general inventive concept.

FIG. 6B is a weighting curve diagram illustrating the second signal processing unit 320 of FIG. 5 applying a different weight to each channel signal according to an embodiment of the present general inventive concept.

Referring to FIG. 6B, geometrical weights are respectively added to the left and right channel signals of the second signal processing unit 320 of FIG. 5 to allow a listener to experience localization through the center speaker array 220 of FIG. 2. For example, a gain of a left channel signal output to the first speaker is set to 1, and a gain of a left channel signal output to the $n^{th}$ speaker is set to 0.2. In addition, a gain of a right channel signal output to the first speaker is set to 0.2, and a gain of a right channel signal output to the $n^{th}$ speaker is set to 1.

Figure 6C:
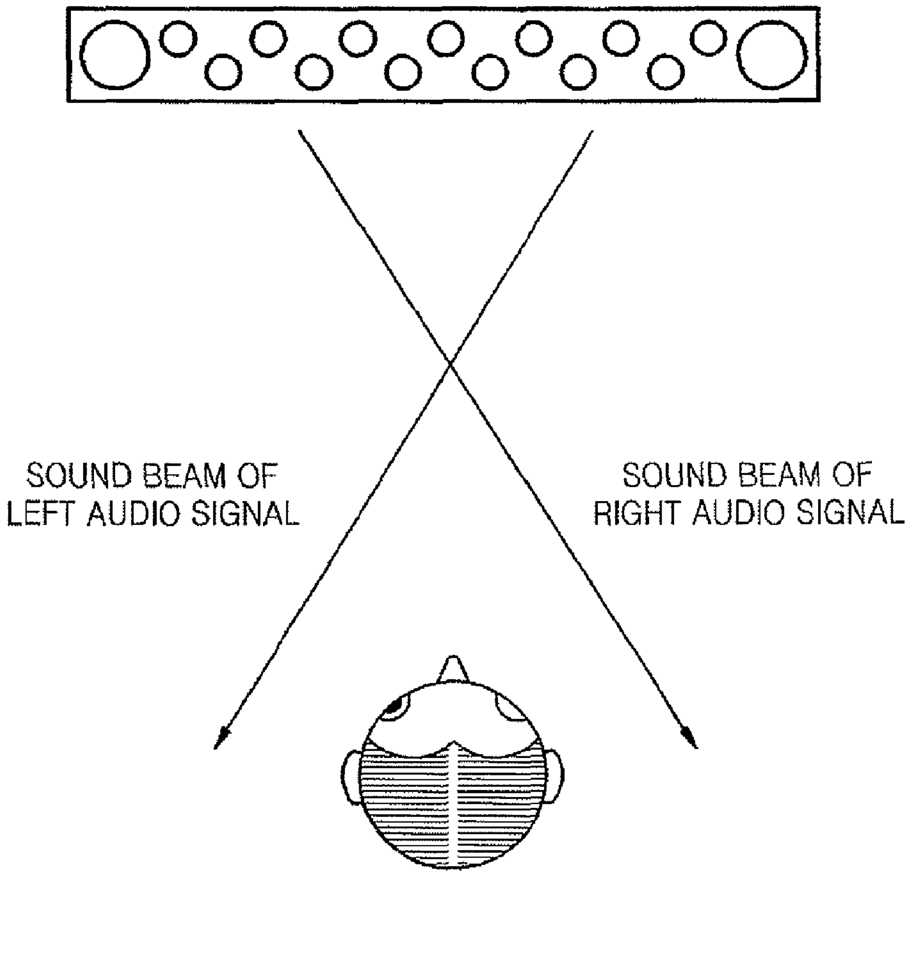
FIG. 6C is a conceptual diagram illustrating sound localization transferred to a listener by applying a different weight to each channel signal in the second signal processing unit according to an embodiment of the present general inventive concept.

FIG. 6C is a conceptual diagram illustrating sound localization transferred to a listener by applying a different weight to each channel signal in the second signal processing unit 320 of FIG. 5, according to an embodiment of the present general inventive concept. For example, a geometrical amplification value can be applied to each gain value of the gain adjusters G1_R, G2_R, . . . GN_R or G1_L, G2_L, . . . GN_L and delay values of the delay units D1_R, D2_R, . . . DN_R or D_L, D2_L, . . . DN_L.

Figure 7A:
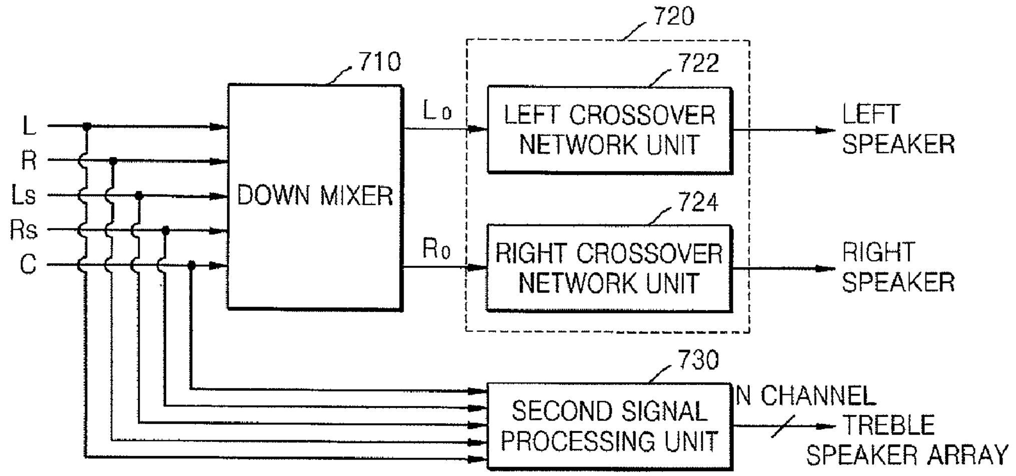
FIG. 7A is a block diagram of the controller illustrated in FIG. 2 when an input signal is a multi-channel signal, according to an embodiment of the present general inventive concept.

FIG. 7A is a block diagram of the controller 210 illustrated in FIG. 2 when an input signal is a multi-channel signal, according to an embodiment of the present general inventive concept.

Referring to FIG. 7A, a down-mixer 710 down-mixes the multi-channel signal (e.g., a left channel signal L, a center channel signal C, a right channel signal R, a left surround channel signal $L_S$, and a right surround channel signal $R_S$) to two channel signals. For example, the down-mixer 710 generates a left channel signal $L_0$ and a right channel signal $R_0$ from the multi-channel signal using an Equation 1.

[EQUATION 1]

$$L_0=0.5\times(L+0.707\times C+L_S)$$

$$R_0=0.5\times(R+0.707\times C+R_S) \quad (1)$$

A first signal processing unit 720 includes a left crossover network unit 722 and a right crossover network unit 724 and operates in the same manner as the first signal processing unit 310 illustrated in FIG. 3.

A second signal processing unit 730 generates signals corresponding to the number of speakers of the center speaker array 220 of FIG. 2 by copying the left channel signal L, the center channel signal C, the right channel signal R, the left surround channel signal $L_S$, and the right surround channel signal $R_S$, amplifies and/or delays the generated signals based on the channels, and outputs the amplified and/or delayed signals to the corresponding speakers of the center speaker array 220. Thus, the second signal processing unit 730 generates sound beam signals by applying a constant delay and gain to each channel.

Figure 7B:
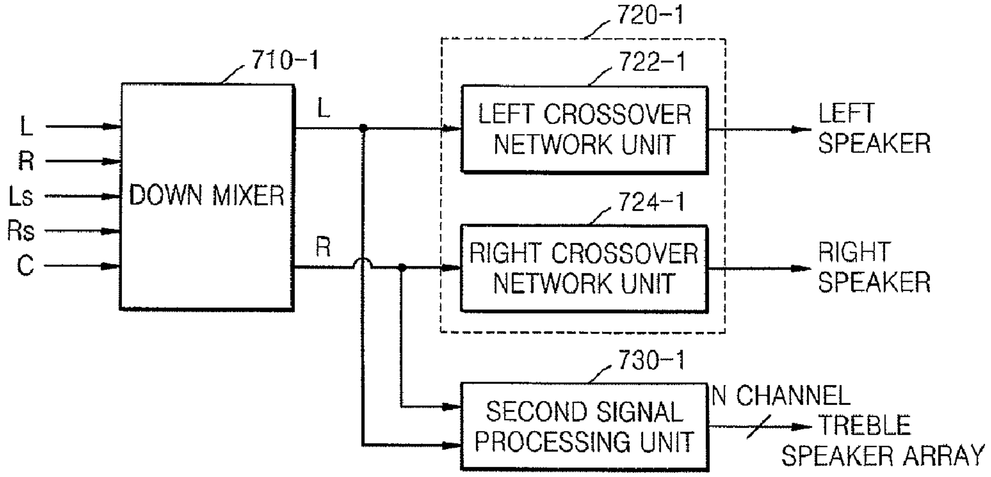
FIG. 7B is a block diagram of the controller illustrated in FIG. 2 when an input signal is a multi-channel signal, according to another embodiment of the present general inventive concept.

FIG. 7B is a block diagram of the controller 210 illustrated in FIG. 2 when an input signal is a multi-channel signal, according to another embodiment of the present general inventive concept.

Referring to FIG. 7B, a down-mixer 710-1 operates the same as the down-mixer 710 illustrated in FIG. 7A.

A first signal processing unit 720-1 includes a left crossover network unit 722-1 and a right crossover network unit 724-1 and operates in the same manner as the first signal processing unit 310 illustrated in FIG. 3.

A second signal processing unit 730-1 operates the same as the second signal processing unit 320 illustrated in FIG. 3.

It will be understood by those of ordinary skill in the art that the present general inventive concept is not limited to the above-described embodiments and various changes in form and details may be made therein without departing from the spirit and scope of the general inventive concept.

The general inventive concept can also be embodied as computer readable codes on a computer readable recording medium. The computer readable recording medium is any data storage device that can store data which can be thereafter read by a computer system. Examples of the computer readable recording medium include read-only memory (ROM), random-access memory (RAM), CD-ROMs, magnetic tapes, floppy disks, optical data storage devices, and carrier waves (such as data transmission through the Internet). The computer readable recording medium can also be distributed over network coupled computer systems so that the computer readable code is stored and executed in a distributed fashion.

Figure 8:
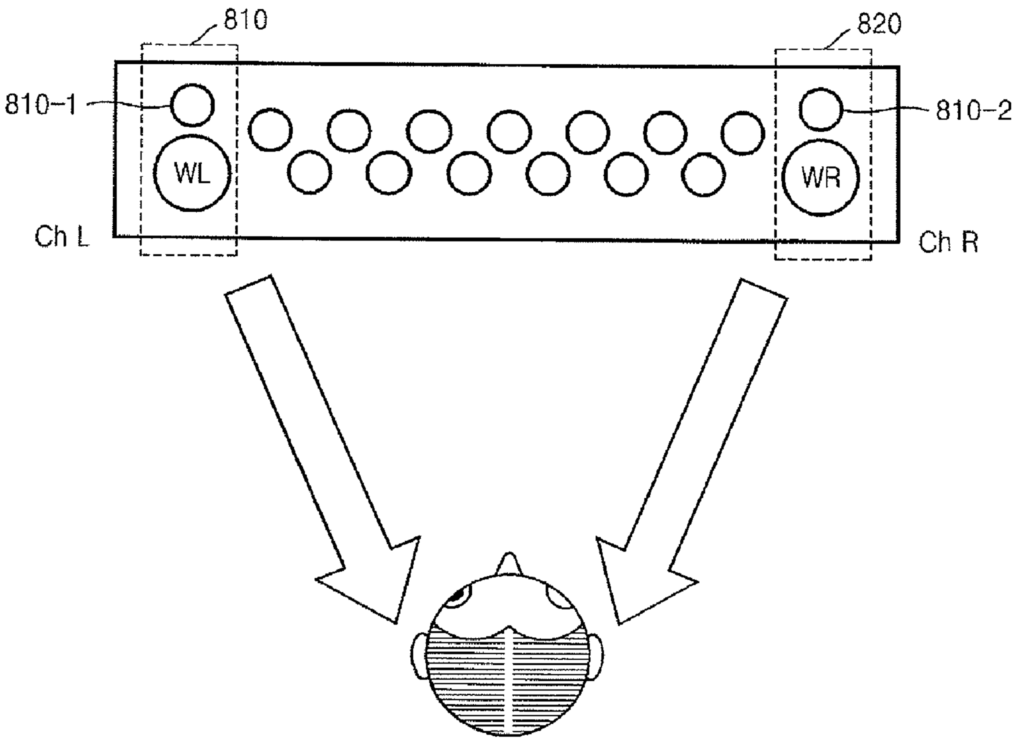
FIG. 8 is a diagram of a front surround sound reproduction system according to another embodiment of the present general inventive concept.

Referring to a front surround sound reproduction system as illustrated in FIG. 8, by respectively disposing treble stereo speakers 810-1 and 810-2 in a left speaker 810 and a right speaker 820, respectively, and by providing an input stereo signal to the treble stereo speakers 810-1 and 810-2, stereo separation and localization can be increased. Thus, by adding only left and right treble speakers to an existing speaker unit, stereo separation and localization can be increased. In addition, by applying geometrical amplification values to a plurality of channel signals, left and right localization can be obtained through a treble (center) speaker array. Thus, localization of the middle/treble region output to the treble speaker array can be enhanced.

Although a few embodiments of the present general inventive concept have been shown and described, it will be appreciated by those skilled in the art that changes may be made in these embodiments without departing from the principles and spirit of the general inventive concept, the scope of which is defined in the appended claims and their equivalents.

What is claimed is:

1. A front surround sound reproduction apparatus using a plurality of speakers, the apparatus comprising:

a controller to determine that a received input audio signal is a stereo signal rather than a multi-channel signal;

a first signal processor to adjust a magnitude and a phase of a plurality of first and second channel signals of the stereo signal for each of a plurality of frequency bands and to output the adjusted signals to left and right treble and bass speakers assigned according to the frequency bands; and a second signal processor to generate a plurality of channel signals by copying the first and second channel signals of the stereo signal, to adjust a signal characteristic of each of the plurality of channel signals using geometrical amplification values, and to output the adjusted signals to a speaker array in a center of the front surround sound reproduction apparatus.

2. The apparatus of claim 1, wherein the first signal processor comprises:

a first crossover network unit to adjust the magnitude and the phase of the first channel signal based on frequency bands and to output the adjusted first channel signal to the left treble and bass speakers; and a second crossover network unit to adjust the magnitude and the phase of the second channel signal based on frequency bands and to output the adjusted second channel signal to the right treble and bass speakers.

3. The apparatus of claim 2, wherein the first crossover network unit comprises:

a high-pass filter to perform high-pass filtering on the first channel signal;

a treble signal adjuster to adjust a magnitude and a phase of a treble signal filtered by the high-pass filter and to output the adjusted treble signal to the left treble speaker;

a low-pass filter to perform low-pass filtering on the first channel signal; and a bass signal adjuster to adjust a magnitude and a phase of a bass signal filtered by the low-pass filter and to output the adjusted bass signal to the left bass speaker.

4. The apparatus of claim 2, wherein the second crossover network unit comprises:

a high-pass filter to perform high-pass filtering of the second channel signal;

a treble signal adjuster to adjust a magnitude and a phase of a treble signal filtered by the high-pass filter and to output the adjusted treble signal to the right treble speaker;

a low-pass filter to perform low-pass filtering on the second channel signal; and a bass signal adjuster to adjust a magnitude and a phase of a bass signal filtered by the low-pass filter and to output the adjusted bass signal to the right bass speaker.

5. The apparatus of claim 1, wherein the second signal processor comprises:

a signal copying unit to generate N channel signals by copying each of the first and second channel signals, where N denotes a number of speakers of the speaker array; and a signal adjuster to sequentially amplify and delay the N channel signals generated based on each of the first and second channels by the signal copying unit and to output the N amplified and delayed channel signals to corresponding speakers of the speaker array.

6. The apparatus of claim 5, wherein the signal adjuster applies geometrical amplification values to the N channel signals.

7. A front surround sound reproduction apparatus using a plurality of speakers, the apparatus comprising:

a controller to determine that a received input audio signal is a multi-channel signal rather than a stereo signal;

a down mixer to down mix the multi-channel signal to first and second channel signals;

a first signal processor to adjust a magnitude and a phase of the first and second channel signals down-mixed by the down mixer for each of a plurality of frequency bands and to output the adjusted signals to left and right treble and bass speakers assigned according to the frequency bands; and a second signal processor to generate a plurality of channel signals by copying the first and second channel signals, to adjust a signal characteristic of each of the plurality of channel signals using geometrical amplification values, and to output the adjusted signals to a speaker array in a center of the front surround sound reproduction apparatus.

8. A front surround sound reproduction apparatus using a plurality of speakers, the apparatus comprising:

a controller to determine that a received input audio signal is a multi-channel signal rather than a stereo signal;

a down mixer to down mix the multi-channel signal to first and second channel signals;

a first signal processor to adjust a magnitude and a phase of the first and second channel signals down-mixed by the down mixer for each of a plurality of frequency bands and to output the adjusted signals to left and right treble and bass speakers assigned according to the frequency bands;

a second signal processor to generate a plurality of channel signals by copying the multi-channel signal, to adjust a signal characteristic of each of the plurality of channel signals using geometrical amplification values, and to output the adjusted signals to a speaker array in a center of the front surround sound reproduction apparatus.

9. A front surround sound reproduction method using a plurality of speakers, the method comprising:

determining whether an input signal is a stereo sound corresponding to first and second channels or a multi-channel signal;

if it is determined that the input signal is a multi-channel signal, converting the multi-channel signal to first and second channel signals by down mixing the multi-channel signal;

adjusting a magnitude and a phase of the first and second channel signals down-mixed for each of a plurality of frequency bands and outputting the adjusted signals to left and right treble and bass speakers assigned according to the frequency bands; and generating a plurality of channel signals by copying the first and second channel signals, adjusting a signal characteristic of each of the plurality of channel signals using geometrical amplification values, and outputting the adjusted signals to a speaker array in a center of the front surround sound reproduction apparatus.

10. The method of claim 9, wherein the outputting of the adjusted signals to the speaker array in the center comprises applying the geometrical amplification values to the plurality of channel signals.

11. A front surround sound reproduction apparatus comprising:

a controller to determine that a received input audio signal is a stereo signal rather than a multi-channel signal;

a first signal processor to adjust a magnitude and a phase of a left channel signal and a right channel signal of the stereo signal of each of a plurality of frequency bands and to output the adjusted left channel signal and the adjusted right channel signal to a left treble and bass speaker and a right treble and bass speaker, respectively; and a second signal processor to generate copies of the left channel signal and the right channel signal of the stereo signal to correspond to each of a plurality of speakers in a speaker array and to sequentially amplify and delay the generated copies based on positions of each of the plurality of speakers in the speaker array and by using geometrical amplification values.

12. The front surround sound reproduction apparatus of claim 11, wherein the second signal processor sequentially amplifies and delays the generated copies by applying the geometrical amplification values to the generated copies based on the positions of each of the plurality of speakers in the speaker array.

13. The front surround sound reproduction apparatus of claim 11, wherein frequency characteristics of the left channel signal and the right channel signal comprise the magnitude and the phase of the left channel signal and the right channel signal.

14. A front surround sound reproduction method using a left speaker, a right speaker, and a speaker array, the method comprising:

determining that a received input audio signal is a stereo signal rather than a multi-channel signal;

adjusting a magnitude and a phase of a left channel signal and a right channel signal of the stereo signal for each of a plurality of frequency bands;

outputting the adjusted left channel signal and the adjusted right channel signal to the left treble and bass speaker and the right treble and bass speaker respectively according to the frequency bands;

generating copies of the left channel signal and the right channel signal of the stereo signal to correspond to each of a plurality of speakers in the speaker array; and sequentially amplifying and delaying the generated copies based on positions of each of the plurality of speakers in the speaker array and by using geometric amplification values.

15. The front surround sound reproduction method of claim 14, wherein the sequential amplification and delay of the generated copies occurs by applying the geometrical amplification values to the generated copies based on the positions of each of the plurality of speakers in the speaker array.

16. The front surround sound reproduction method of claim 14, wherein frequency characteristics of the left channel signal and the right channel signal comprise the magnitude and the phase of the left channel signal and the right channel signal.

17. A front surround sound reproduction method using a speaker array, the method comprising:

receiving a left channel signal and a right channel signal, and determining that the received left channel signal and right channel signal are of a stereo signal rather than a multi-channel signal;

adjusting a magnitude and a phase of each of the left and right channel signals of the stereo signal for each of a plurality of frequency bands;

generating copies of the left channel signal and the right channel signal of the stereo signal to correspond to each of a plurality of speakers in the speaker array; and sequentially amplifying and delaying the generated copies based on positions of each of the plurality of speakers in the speaker array.

* * * * *